United States Patent [19]
Aird

[11] 3,893,229
[45] July 8, 1975

[54] MOUNTING FOR LIGHT-EMITTING DIODE PELLET AND METHOD FOR THE FABRICATION THEREOF

[75] Inventor: Alanson D. Aird, North Syracuse, N.Y.

[73] Assignee: General Electric Company, Syracuse, N.Y.

[22] Filed: Oct. 29, 1973

[21] Appl. No.: 410,640

[52] U.S. Cl. ....................... 29/589; 29/591; 357/17; 357/68; 357/71
[51] Int. Cl. ............................................... B01j 17/00
[58] Field of Search .......... 29/569 L, 589, 590, 591; 317/235 N, 234 N

[56] References Cited

UNITED STATES PATENTS

| | | | |
|---|---|---|---|
| 3,529,217 | 9/1970 | Van Santen | 318/235 N |
| 3,548,193 | 12/1970 | Wendland | 317/235 N |
| 3,649,838 | 3/1972 | Phelan | 317/235 N |
| 3,780,427 | 12/1973 | Jenkins | 29/590 |

*Primary Examiner*—W. Tupman
*Attorney, Agent, or Firm*—Robert J. Mooney; Douglas E. Stoner

[57] ABSTRACT

A layer of titanium is deposited on a glass substrate and a layer of gold is deposited over the layer of titanium. The titanium layer is approximately 100 to 1,000 A thick and the gold layer is approximately 5,000 to 15,000 A, thick. The gold-titanium layer is then masked and etched so that a selected portion of the glass substrate is exposed. The selected portion has dimensions slightly smaller than those of the surface of the N-layer of a gallium arsenide light-emitting diode pellet. A layer of germanium approximately 1,000 to 5,000 A thick is deposited over the gold-titanium layer and is masked and etched so that it, too, exposes the selected portion of the glass substrate. The light-emitting diode pellet is placed with the peripheral portion of the surface of its N-layer in overlapping contact with the germanium layer and the remainder of the surface of the N-layer in registry with the selected portion of the substrate. The light-emitting diode is then pressed against the germanium layer for several seconds at an elevated temperature sufficient to form a gold-germanium alloy which bonds the pellet to the titanium.

13 Claims, 8 Drawing Figures

MOUNTING FOR LIGHT-EMITTING DIODE PELLET AND METHOD FOR THE FABRICATION THEREOF

BACKGROUND OF THE INVENTION

1. Field of the Invention

This invention relates to light-emitting semiconductor diode pellets and, more particularly, to an improved means and method for mounting a light-emitting diode pellet on a transparent substrate.

2. Description of the Prior Art

Light-emitting diodes (hereinafter sometimes called L.E.D.'s) include a pellet with an N-layer and a P-layer of monocrystalline semiconductor material, such as gallium arsenide, whose interface defines a P/N junction. As is well known in the prior art, ohmic contact is established with the respective N-and P-layers and an external circuit and light is emitted at the junction when current flows across the junction. Inasmuch as the light originating at the junction travels through a portion of the semiconductor material of the diode and emanates from an external surface thereof, as a practical matter, the pellet can be considered to have a light-emitting surface. It is often desirable to mount an L.E.D. pellet with its light-emitting surface facing and in contiguous or nearly contiguous contact with a pellet substrate or support of glass or other transparent material in a manner which permits the emitted light to pass therethrough. However, when mounting the L.E.D. pellet to the glass substrate in this manner, it is necessary to make provision for establishing an ohmic contact with the light-emitting surface. Furthermore, since the L.E.D. pellet and the glass substrate will commonly be subjected to subsequent processes requiring their handling as a unit, the mechanical bond between the transparent substrate and the light-emitting surface must be strong enough to withstand both the handling and the subsequent processes.

One prior art method for mounting an L.E.D. pellet to a glass substrate with its light-emitting surface confronting the substrate is as follows. A layer of titanium or other metal that adheres to glass, is deposited on the substrate. The layer is generally rectangular in shape and its area is only a small fraction of the area of the light-emitting surface. A layer of gold substantially coextensive with the titanium layer is deposited thereon. The L.E.D. pellets used in the practice of this method include a small dot of a gold-germanium alloy on the light-emitting surface near one edge thereof and in ohmic contact therewith. The dot is small compared to the light-emitting surface. Typically, the L.E.D. pellet, and thus the light-emitting surface, is approximately 0.015 inches square and the dot is 0.003 to 0.004 in diameter. To mount the pellet, it is placed with the light-emitting surface confronting the substrate and the gold-germanium dot on the gold layer. The pellet is then pressed against the substrate for a few seconds at an elevated temperature to form a bond between the dot and the gold layer. Consequently the pellet is then mechanically coupled to the substrate and electrically coupled to the gold such that a wire when bonded to the gold and titanium layers will be in ohmic contact with the light-emitting surface. However, inasmuch as the bonding material is under only one edge of the pellet, an angular juxtaposition exists between the pellet and the substrate.

A problem sometimes encountered with this prior art method is that some units manufactured in accordance therewith are unsuitable for use because of cracks which form in the L.E.D. pellet when it is subjected to the heat and pressure required for bonding to the glass substrate. Further problems sometimes develop when subsequent fabrication processes involving the unit are performed. For example when subsequent processes are performed, the mechanical bond between the L.E.D. pellet and the glass substrate sometimes fails, thus causing additional units to be unsuitable for further use.

It is now felt that many of these cracking failures are due to the fact that the layer of conductive material on the glass substrate and the gold-germanium dot are under only one edge of the light-emitting surface of the L.E.D. pellet. Bonding the pellet to the substrate along only one edge and in a nonparallel relationship, subjects the pellet to bending stresses when bonding pressure is applied. Thus cracking may occur.

Furthermore, the prior art method also requires an additional bond to be made to securely mount the L.E.D. pellet to the glass substrate so that handling as a unit is possible and the aforementioned bond failures are avoided. This additional bond is made using an epoxy resin spanning between the pellet and the substrate near the edge of the pellet opposite the dot. This subsequent bonding step is expensive and furthermore may fail when subsequent bonding processes requiring heat and pressure are performed.

Consequently, while the prior art method yields usable pellet-glass substrate units, there is a considerable proportion of such units which must be rejected.

SUMMARY OF THE INVENTION

The present invention overcomes the problems associated with the prior art mounting method by enabling both a permanent ohmic electrical connection with the light-emitting surface and a secure mechanical bond between the L.E.D. pellet and the transparent substrate to be provided in a single operation which eliminates the need for any subsequent processing at elevated temperatures or pressures. The method of the present invention comprises first forming a layer of electrically conductive material onto a transparent substrate. The layer is formed in a pattern which exposes a selected portion of the substrate and preferably includes an extended portion to which a lead providing an external electrical connection can be ultimately attached. The L.E.D. pellet is then placed on the electrically conductive layer with its light-emitting surface in overlying registry with the exposed portion of the substrate and with a marginal or peripheral portion of its light-emitting surface in face down contact with the electrically conductive layer. The L.E.D. pellet is then bonded to the layer of electrically conductive material by heat and pressure and this establishes permanent ohmic contact between the light-emitting surface and the layer of electrically conductive material while simultaneously securely and permanently mounting the pellet on the transparent substrate.

According to one embodiment of the invention, the surface of the N-layer of a light-emitting diode (L.E.D.) pellet is mounted to a glass substrate. First, a layer of titanium is deposited onto a glass substrate and a layer of gold is deposited over the titanium layer. The gold-titanium layer thus formed is masked and etched to expose a selected portion of the glass substrate. The exposed portion is bonded by the gold-titanium layer and has dimensions slightly smaller than those of the surface of N-layer of the L.E.D. pellet. A layer of germanium is then deposited on the glass substrate and over the gold-titanium layer and is masked and etched to expose the selected portion. The pellet is placed with the peripheral portion of the light-emitting N-layer in contact with the germanium layer and is then heated to cause the germanium layer and a portion of the gold layer to form an alloy which strongly adheres to the surface of the N-layer and forms ohmic contact therewith.

In an alternate embodiment, only two sides of the portion of the glass substrate which is exposed are bounded by spacially separated gold-titanium and germanium layers which are part of a U shaped pattern.

It is a general object of this invention to provide a new and improved method for mounting a light-emitting diode pellet on a transparent substrate.

It is another object of this invention to provide a method of mounting a light-emitting diode pellet on a transparent substrate so that the pellet is securely mounted on the substrate, a portion of the light-emitting surface of the pellet is exposed to the substrate and ohmic contact is made with the light-emitting surface of the pellet.

BRIEF DESCRIPTION OF THE DRAWINGS

These and other features and objects of the present invention will be apparent upon a perusal of the following description taken in conjunction with the accompanying FIGURES wherein.

DESCRIPTION OF THE PREFERRED EMBODIMENTS

Figure 1:
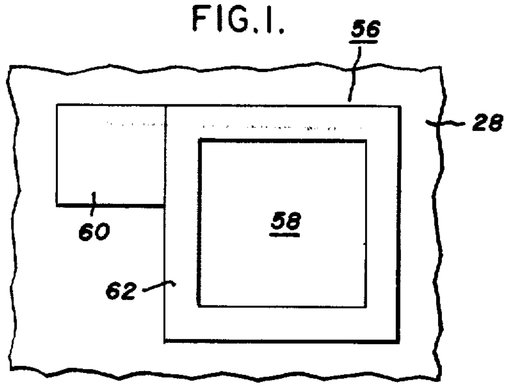
FIG. 1 is a plan view of a glass substrate illustrating the steps taken in preparation for bonding an L.E.D. pellet thereto.
Figure 2:
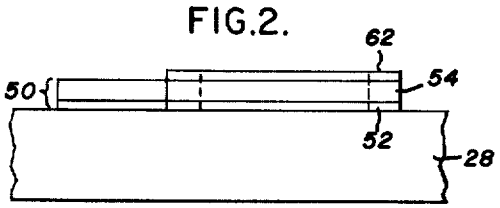
FIG. 2 is an elevation view of the glass substrate shown in FIG. 1.

Referring generally to FIGS. 1 through 4, one embodiment of the present invention will now be described in detail.

First a layer 52 of a material adherent to both the substrate and conductive material is deposited on glass substrate 28 to a thickness of from 100 to 1,000 A. For example, titanium 52 can be used. Next, an alloy foundation metal that adheres to the titanium 52 is deposited thereover to a thickness of approximately 5,000 to 15,000 A. For example, a layer of gold 54 can be employed. The thickness of the layers 52 and 54 and layers to be subsequently illustrated is exaggerated for clarity. Of course, one skilled in the art will recognize that if the transparent substrate 28 is made of a material other than glass, such as quartz or sapphire, the substrate adherent layer 52 used beneath the alloy foundation layer 54 may be a material other than titanium. Furthermore it will be appreciated that, even on glass, other materials, such as chromium, could be used.

Figure 3:
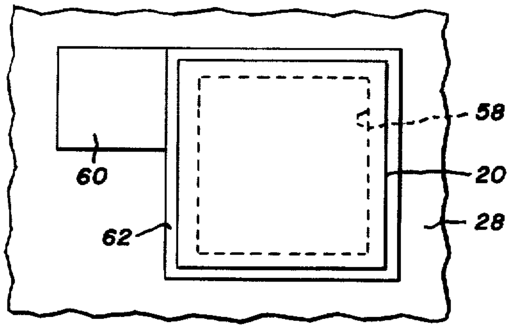
FIG. 3 is a plan view of the glass substrate shown in FIG. 1 with a light-emitting diode pellet positioned thereon for bonding.
Figure 4:
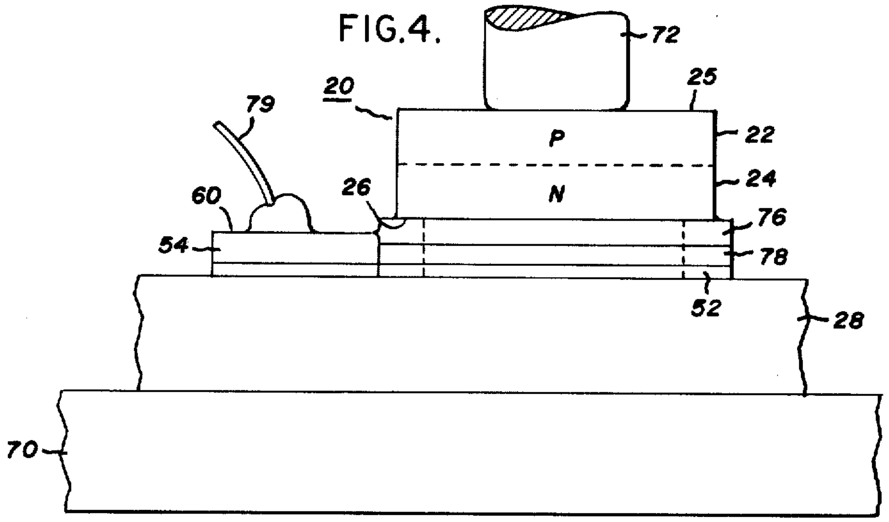
FIG. 4 is an elevation view of the substrate during the bonding step.

According to the subject invention, the next step comprises masking and etching the base layer 50 which comprises the substrate adherent titanium layer 52 and the alloy foundation gold layer 54. The base layer 50 is shown in the FIGURES after the etching step. A pattern 56 which is formed during etching includes several spacially separated areas and exposes a selected portion 58 of the glass substrate 28 and bounds that portion. The selected portion 58 has dimensions slightly smaller than those of the light-emitting surface 26 of an L.E.D. pellet 20 as shown in FIGS. 3 and 4. The masking and etching also forms a conductive contact tab 60. Next, the alloy foundation layer 54 is prepared to adhere to the L.E.D. pellet 20 and a dopant is supplied to provide ohmic contact with the light-emitting surface by depositing a dopant layer in a thickness of from 1,000 to 5,000 A on the glass substrate 28 over the gold-titanium base layer 50. It has been found that germanium is a desirable dopant for gallium arsenide. The germanium dopant layer 62 is then etched to expose the selected portion 58 and the tab 60 as shown in FIGS. 1–4.

Referring now to FIGS. 3 and 4, the glass substrate 28 with the layers of titanium, gold and germanium formed thereon is placed on a table 70 which is maintained at a temperature of 300°C. An L.E.D. pellet 20 is then placed on the glass substrate 28. The pellet 20 is a monocrystalline body of one of the semiconductor materials commonly used to form light-emitting diodes. Such materials include gallium arsenide phosphide and gallium aluminum arsenide. Gallium arsenide has been found to be particularly compatible with titanium, gold and germanium layers. The pellet 20 has been suitably doped to provide a P-layer 22 and an N-layer 24 as is well known in the prior art. A P/N junction separates the layers 22 and 24. The P-layer 22 is partially bounded by a surface 25, which is preferably metallized. A surface 26 partially bounds the N-layer 24. When current is passed through the junction, light is emitted therefrom and, inasmuch as the N-layer 24 is conventionally transmissive of that light, the surface 26 serves as a light-emitting surface 26. The pellet 20 is placed with the peripheral portion of the light-emitting surface 26 in contact with the germanium dopant layer 62 as shown in FIGS. 3 and 4.

Bonding proceeds as follows. A heated probe 72 forces the pellet 20 against the germanium dopant layer 62 with a force of approximately 20 to 75 grams. The probe heats to 500°C in 2 to 5 seconds and is then allowed to cool. At this point the bond is complete. These values are approximate and many deviations therefrom are considered within the scope of the invention. For example, it is recognized that the pellet 20 could be placed on the glass substrate 28 prior to placing the substrate on heated table 70 without departing from the spirit of the invention.

The heat and pressure, applied as aforesaid, form a layer of gold-germanium alloy 76 which adheres to the light-emitting surface 26 of the pellet 20 to form ohmic contact therewith. The gold-germanium alloy 76 forms an ohmic contact with the pellet because germanium is an N-type dopant for gallium arsenide. Because the gold layer 54 is thicker than the germanium layer 62, a portion 78 of the gold layer 54 remains between the titanium layer 52 and the gold-germanium alloy layer 76. Inasmuch as the gold-germanium alloy layer 76 is in ohmic contact with the gold layer 78, a lead 79, when ball-bonded to the tab 60, is in ohmic contact with the surface 26 of the pellet 20. Thus, tab 60 forms a conductive contact terminal for the surface 26 and facilitates the connection of the pellet 20 to an external circuit.

Bonding the peripheral portion of the surface 26 of the pellet 20 to the gold-germanium alloy layer 76 securely mounts the pellet 20 on the glass substrate 28. This enables subsequent handling of the L.E.D. pellet-glass substrate unit and lead bonding to the surface 25 of the P-layer 22 to be performed by conventional methods but without the danger of disturbing the bond between the pellet 20 and the glass substrate 28. Also, inasmuch as only the peripheral portion of the surface 26 is sealed and the portion 58 is exposed, impurities are prevented from contaminating surface 26 during operation but the light-emitting surface is optically exposed through the substrate 28.

It is recognized, of course, that the use of the heated table 70 is not necessary to cause the gold and germanium layers to alloy. Table 70 is used only because it heats the gold and germanium layers close to their eutectic temperature (356°) so that the probe 72 need only be in contact with the pellet 20 for about 2 to 5 seconds, thus reducing bonding time, a desirable feature when the units are to be mass produced.

Gold and germanium are used herein, in part, because of the affinity of their alloy for gallium arsenide and their property of each individually having a higher melting point than when they are combined in an alloy. Furthermore, gold-germanium alloy melts at a temperature above that used in thermal compression lead bonding, thus facilitating subsequent lead bonding. The use of any material, or combination of materials which will conduct electricity, establish ohmic contact with the light-emitting surface of the L.E.D. and establish a secure bond between the transparent substrate and the L.E.D. will be, in view of the foregoing, within the spirit of the invention.

Figure 5:
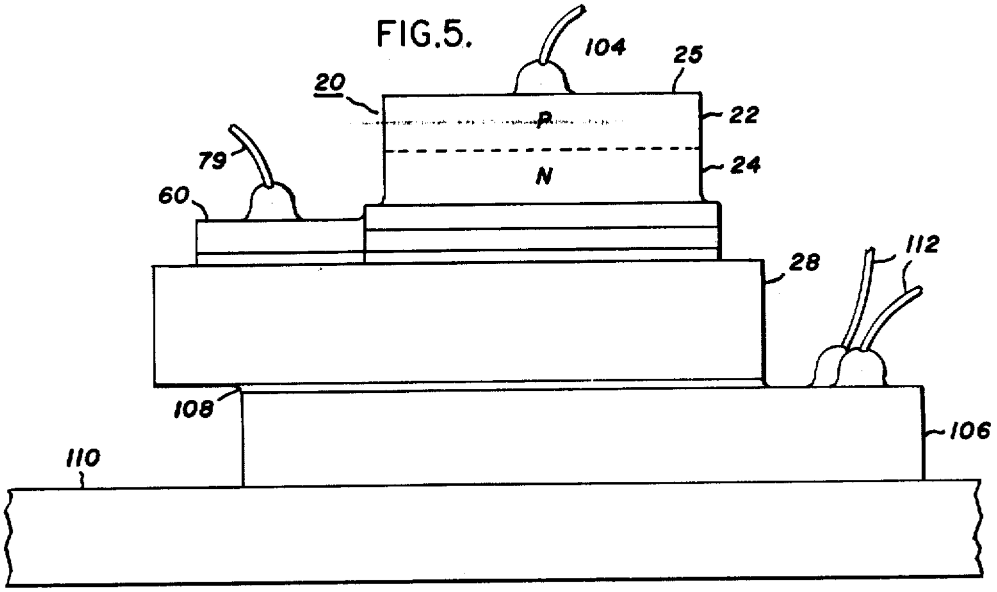
FIG. 5 is an elevation view of a coupler which comprises a photo responsive device on the substrate and is fabricated in accordance with the subject invention.

Referring now to FIG. 5, there is shown a second embodiment of the invention which is a coupler including an L.E.D. pellet 20 mounted on a glass substrate 28 as described above. In addition to the ball-bonded lead 79, an additional lead 104 has been ball-bonded to the surface 25 thus establishing ohmic contact to the P-layer 22. A photo-responsive device 106 with a light sensitive surface is bonded to the glass substrate 28 with the light-sensitive surface thereagainst. Device 106 can be a light activated SCR, photo transistor, etc.

The bond 108 between the substrate 28 and the device 106 can be formed in many ways. For example, the bond 108 can be electrostatically formed or can comprise clear epoxy or silicone rubber cement. Device 106 is coupled to a metal substrate 110, such as a lead frame or a header, by conventional techniques such as forming a gold-silicon alloy bond. Metal substrate 110 can serve as a contact for the device 106 and, in addition, two ball-bonded leads 112 are shown. The contact arrangement shown for the device 106 is exemplary.

The arrangement used will, of course, depend on the nature of the device 106.

A highly efficient coupler is depicted in FIG. 5. It may be encapsulated or otherwise housed if desired. When the pellet 20 is energized via the leads 79 and 104, the light emitted at the junction is transmitted by the substrate 28 to the device 106 which then responds. Consequently, two circuits can be coupled, yet complete electrical isolation is maintained by the glass 28. Efficiency can be enhanced, of course, if substrate 28 is chosen to be a material that is particularly transmissive of the wavelength emitted by the L.E.D. pellet 20, be it visible, infrared, etc.

Figure 6:
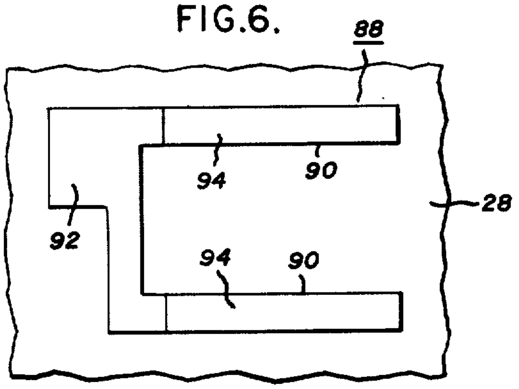
FIG. 6 is a plan view of a glass substrate illustrating steps of a second preferred method.
Figure 7:
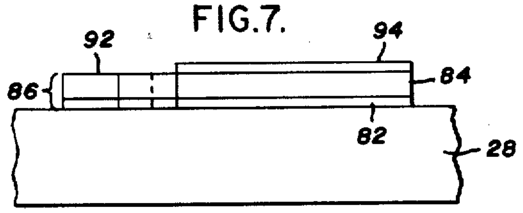
FIG. 7 is an elevation view of the glass substrate shown in FIG. 6.
Figure 8:
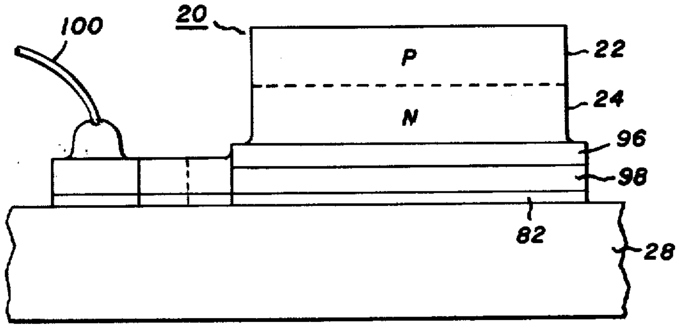
FIG. 8 is an elevation view of the glass substrate shown in FIGS. 6 and 7 during the bonding step.

Referring now to FIGS. 6, 7 and 8, a third embodiment of the present invention is shown. A substrate adherent layer of titanium 82 and an alloy foundation layer of gold 84 are deposited on the glass substrate 28 as before. The functions of the layers are as described above. The gold-titanium layer 86 is masked and etched to form a U-shaped pattern 88 on the glass substrate 28. The legs 90 of the U-shaped pattern 88 have a length approximately the same as two opposing sides of the light emitting surface 26 of the L.E.D. pellet 20.

The U-shaped pattern 88 also includes a tab 92. Next, a dopant layer of germanium 94 is deposited on glass substrate 28 over gold-titanium layer 86. The germanium layer 94 is masked and etched so that it covers the legs 90 of the U-shaped pattern 88. Glass substrate 28 with the titanium, gold and germanium layers thus formed thereon is shown in FIGS. 6 and 7. Glass substrate 28 is then placed on a heated table as before and the pellet 20 is placed on the germanium layer 94 so that two opposing sides of the periphery of the light-emitting surface 26 of the L.E.D. pellet 20 overlie the legs 90 of the pattern 88. A heated probe is brought into contact with the L.E.D. pellet 20 as before and a bond is formed. Referring to FIG. 7, a gold-germanium alloy layer 96 is formed on the legs 90 and the pellet 20 is securely mounted to the glass substrate 28 due to the bonding of legs 90 to the surface 26. Inasmuch as the legs are spacially separated, the L.E.D. will be securely mounted. A contact tab portion 98 of the gold layer 84 remains as before and a lead 100 may be bonded to the tab 92 so that a terminal for the surface 26 is formed.

It will be apparent to those skilled in the art that the patterns of the layers of titanium, gold, and germanium disclosed herein in the embodiments shown are not intended to be the only patterns which could be used. Any pattern including two spacially separated areas of the particular material used which will cause the L.E.D. pellet to be securely mounted on the transparent substrate when the material and the L.E.D. pellet are bonded together is within the spirit of the invention. For example, an L shaped pattern that covers two adjacent edges of the pellet can be used.

Although only three specific embodiments of the invention have been shown, those skilled in the art will readily perceive many modifications. For example, some L.E.D. pellets emit light from the P surface. An L.E.D. pellet can be mounted P surface down by the subject method if the gold-germanium alloy is doped with zinc to form an ohmic contact with a P layer. Or, a light sensing device can be added to the embodiment depicted in FIG. 8 thus forming a coupler similar to that shown in FIG. 5. Consequently, it is intended by the appended claims to cover all modifications as fall within the true spirit and scope of the invention.

What is claimed as new and is desired to be secured by Letters Patent of the United States is:

1. A method for mounting a gallium arsenide light-emitting diode pellet having a light-emitting surface to a glass substrate, the method comprising the steps of:

a. forming a titanium layer on said glass substrate;

b. forming a gold layer on said titanium layer to form a gold-titanium layer, said gold-titanium layer being in a pattern which exposes a portion of said glass substrate;

c. forming a germanium layer on said gold-titanium layer, said layer of germanium covering a portion of said gold-titanium layer proximate to said exposed portion of said glass substrate;

d. placing said light-emitting diode pellet on said germanium layer with said light-emitting surface in contact therewith so that a portion of said light-emitting surface overlies said exposed portion of said glass substrate; and e. bonding said light-emitting diode pellet to said germanium layer under pressure at a temperature and for a time sufficient to cause said gold layer and said germanium layer to form a gold-germanium alloy layer which is in ohmic contact with said light-emitting surface, said gold-germanium alloy layer having a configuration which securely mounts said light-emitting diode pellet to said glass substrate.

2. The method recited in claim 1 wherein:

a. said pattern is formed by masking and etching said gold-titanium layer;

b. the step of forming said germanium layer comprises the sub-steps of:

i. depositing a germanium layer on said gold-titanium layer, and ii. masking and etching said germanium layer.

3. The method recited in claim 2 wherein:

a. said gold layer is approximately 5,000 to 15,000 A thick; and b. said germanium layer is approximately 1,000 to 5,000 A thick.

4. The method recited in claim 3 wherein:

a. before bonding said light-emitting diode pellet to said germanium layer, said glass substrate is placed on a table maintained at a temperature of approximately 300°C; and b. the step of bonding said light-emitting diode pellet to said germanium layer comprises forcing said light-emitting diode pellet against said germanium layer for several seconds using a heated probe.

5. The method recited in claim 2 wherein:

a. said exposed portion of said glass substrate is rectangular;

b. said germanium layer covers that portion of said gold-titanium layer proximate to said exposed portion of said glass substrate; and c. said light-emitting diode pellet is placed with the periphery of said light-emitting surface in contact with said germanium layer.

6. The method recited in claim 5 wherein:

a. said gold layer is approximately 5,000 to 15,000 A thick;

b. said germanium layer is approximately 1,000 to 5,000 A thick;

c. before bonding said light-emitting diode pellet to said germanium layers, said glass substrate is placed on a table maintained at a temperature of approximately 300°C; and d. the step of bonding said light-emitting diode pellet to said germanium layer comprises forcing said light-emitting diode pellet against said germanium layer with a force of approximately 20 to 75 grams for 2 to 5 seconds using a probe which reaches a maximum temperature of approximately 500°C.

7. The method recited in claim 6 wherein said pattern includes a tab forming a terminal for said light-emitting surface.

8. The method recited in claim 2 wherein:

a. said pattern is U-shaped having two legs;

b. said germanium layer substantially covers said legs; and c. said light-emitting diode pellet is placed with two opposing sides of the periphery of said light-emitting surface in contact with said germanium layer.

9. The method recited in claim 8 wherein:

a. said gold layer is approximately 5,000 to 15,000 A thick;

b. said germanium layer is approximately 1,000 to 5,000 A thick;

c. before bonding said light-emitting diode pellet to said germanium layer, said glass substrate is placed on a table maintained at a temperature of approximately 300°C; and d. the step of bonding said light-emitting diode pellet to said germanium layer comprises forcing said light-emitting diode pellet against said germanium layer with a force of approximately 20 to 75 grams for 2 to 5 seconds using a probe which reaches a maximum temperature of approximately 500°C.

10. The method recited in claim 9 wherein said pattern includes a tab forming a terminal for said light-emitting surface.

11. The method recited in claim 10 comprising the further step of bonding the light sensitive surface of a light-sensitive device to the surface of said glass substrate opposite said diode pellet.

12. The method recited in claim 11 wherein said step of bonding a light sensitive device comprises the step of bonding with a silicone rubber cement.

13. The method recited in claim 11 comprising the further step of bonding the surface of said light-sensitive device opposite said light-sensitive surface to a metal substrate.

* * * * *